US012474643B2

(12) United States Patent
Mehendale et al.

(10) Patent No.: US 12,474,643 B2
(45) Date of Patent: Nov. 18, 2025

(54) SYSTEM AND METHOD FOR PERFORMING ALIGNMENT AND OVERLAY MEASUREMENT THROUGH AN OPAQUE LAYER

(71) Applicant: Onto Innovation Inc., Wilmington, MA (US)

(72) Inventors: Manjusha Mehendale, Morristown, NJ (US); George Andrew Antonelli, Portland, OR (US); Priya Mukundhan, Lake Hopatcong, NJ (US); Robin A. Mair, West Chicago, IL (US); Francis C. Vozzo, Randolph, NJ (US)

(73) Assignee: Onto Innovation Inc., Wilmington, MA (US)

( * ) Notice: Subject to any disclaimer, the term of this patent is extended or adjusted under 35 U.S.C. 154(b) by 196 days.

(21) Appl. No.: 18/253,581

(22) PCT Filed: Nov. 22, 2021

(86) PCT No.: PCT/US2021/060385
§ 371 (c)(1),
(2) Date: May 18, 2023

(87) PCT Pub. No.: WO2022/109411
PCT Pub. Date: May 27, 2022

(65) Prior Publication Data
US 2024/0004311 A1 Jan. 4, 2024

Related U.S. Application Data

(60) Provisional application No. 63/117,443, filed on Nov. 23, 2020.

(51) Int. Cl.
*G03F 7/00* (2006.01)

(52) U.S. Cl.
CPC ...... *G03F 7/70633* (2013.01); *G03F 7/70653* (2023.05); *G03F 7/706849* (2023.05)

(58) Field of Classification Search
CPC ....... G01N 21/1702; G01N 2021/1725; G01N 21/1717; G01N 29/2418;
(Continued)

(56) References Cited

U.S. PATENT DOCUMENTS 8,179,530 B2   5/2012  Levy et al.
8,312,772 B2  11/2012  Tas et al.
(Continued)

FOREIGN PATENT DOCUMENTS

CN   109164046 A    1/2019
EP     1150173 B1  11/2006
(Continued)

OTHER PUBLICATIONS

International Search Report and Written Opinion dated Mar. 15, 2022, from PCT Application No. PCT/US2021/060385 filed Nov. 22, 2021.
(Continued)

*Primary Examiner* — Christina A Riddle
(74) *Attorney, Agent, or Firm* — Paradice & Li LLP

(57) ABSTRACT

An alignment or overlay target that has an optically opaque layer disposed between the top and bottom target structure is measured using opto-acoustic metrology. A classifier library is generated for classifying whether an opto-acoustic metrology signal is on or off the bottom structure. A target may be measured by acquiring opto-acoustic measurement data for the bottom structure of the target and determining a location of the bottom structure using opto-acoustic metrology data acquired from the different locations over the bottom structure and the classifier library. Locations for acquisition of the data may be based on classification results
(Continued)

of each measurement and a search pattern. The top structure of the target may be optically imaged. The relative position of the top structure with respect to the bottom structure is determined using the opto-acoustically determined location of the bottom structure and the image of the top structure.

23 Claims, 11 Drawing Sheets

(58) Field of Classification Search
CPC ..... G01N 2021/1706; G01N 2021/646; G01N 2021/8416; G01N 2021/8825; G01N 2021/95638; G01N 21/21; G01N 21/211; G01N 21/27; G01N 21/47; G01N 21/55; G01N 21/636; G01N 21/64; G01N 21/9501; G01N 21/956; G01N 21/95684; G01N 2291/0231; G01N 2291/02475; G01N 2291/2697; G01N 29/0672; G01N 29/0681; G01N 29/22; G01N 29/275; G01N 29/348; G01N 29/42; G03F 7/70633; G03F 7/70616; G03F 9/7053; G03F 9/7084; G03F 7/70133; G03F 7/70466; G03F 7/70625; G03F 7/7065; G03F 7/70658; G03F 7/707; G03F 7/70708; G03F 9/7088; G03F 7/70; G03F 7/70483–70541; G03F 7/70605–706851; G03F 9/7049–7061; G03F 7/7085; G01B 11/2441; G01B 17/06; G01B 2210/56; G06T 2207/30148; G06T 7/0004; G06T 7/001; G06T 7/68; H01L 22/12; H01L 2924/00; H01L 2924/0002
USPC ..... 355/18, 30, 52–55, 67–77; 356/399–401, 356/432, 601, 625, 630; 73/627; 438/7, 438/16; 430/324
See application file for complete search history.

(56) References Cited

U.S. PATENT DOCUMENTS

| | | | |
|---|---|---|---|
| 8,567,253 | B2 | 10/2013 | Maris et al. |
| 8,980,651 | B2 | 3/2015 | Yue et al. |
| 10,241,199 | B2 | 3/2019 | Witte et al. |
| 10,788,765 | B2 | 9/2020 | Witte et al. |
| 2004/0174529 | A1* | 9/2004 | Maznev ............. G01B 11/0675 356/502 |
| 2013/0039460 | A1 | 2/2013 | Levy et al. |
| 2013/0084655 | A1 | 4/2013 | Yue et al. |
| 2016/0043008 | A1* | 2/2016 | Murray ................. H01L 22/20 438/5 |
| 2016/0051149 | A1 | 2/2016 | Viator |
| 2019/0026885 | A1 | 1/2019 | Gready et al. |
| 2019/0310284 | A1* | 10/2019 | van Es ................. G01N 29/348 |
| 2020/0142319 | A1* | 5/2020 | Witte .................. G03F 7/70133 |
| 2022/0228973 | A1 | 7/2022 | Mehendale et al. |

FOREIGN PATENT DOCUMENTS

| | | |
|---|---|---|
| KR | 101070000 B1 | 10/2011 |
| KR | 101344107 B1 | 12/2013 |
| KR | 20190017877 A | 2/2019 |
| KR | 102430158 B1 | 8/2022 |
| TW | 201921130 A | 6/2019 |
| WO | 2019145101 A1 | 8/2019 |
| WO | 2019145764 A1 | 8/2019 |

OTHER PUBLICATIONS

G.A. Antonelli, "Studies of the Mechanical Properties of Planar and Patterned Films with Picosecond Ultrasonics," Brown University, PhD dissertation, May 2022, 200 pages.
G.A. Antonelli et al, "Characterization of Mechanical and Thermal Properties Using Ultrafast Optical Metrology," MRS Bulletin, vol. 31, Aug. 2006, 8 pages.
Stephen Edward et al, "Detection of Hidden Gratings Through Multilayer Nanostructures Using Light and Sound," arXiv:1911.08337v1 [physics.app-ph] Nov. 19, 2019, 14 pages.
H.T. Grahn et al, "Picosecond Ultrasonics," IEEE Journal of Quantum Electronics, vol. 25, No. 12, Dec. 1989, 8 pages.
T.J Grimsley et al, "Picosecond Ultrasonic Microscopy of Semiconductor Nanostructures," 1st International Symposium on Laser Ultrasonics, Montreal, CA 2008, 6 pages.
M. Mehendale et al., "Imaging of Overlay and Alignment Markers Under Opaque Layers Using Picosecond Laser Acoustic Measurements : AM: Advanced Metrology," 2021 32nd Annual SEMI Advanced Semiconductor Manufacturing Conference (ASMC), Milpitas, CA, USA, 2021, doi: 10.1109/ASMC51741.2021.9435649.
Prasad Dasari, Nigel Smith, Gary Goelzer, Zhuan Liu, Jie Li, Asher Tan, Chin Hwee Koh, "A comparison of advanced overlay technologies," Proc. SPIE 7638, Metrology, Inspection, and Process Control for Microlithography XXIV, 76381P (Apr. 1, 2010); doi: 10.1117/12.848189.
S. Ramanathan et al, "High-Resolution Picosecond Acoustic Microscopy for Non-Invasive Characterization of Buried Interfaces," J. Mater. Res., vol. 21, No. 5, May 2006, 5 pages.
Nigel P. Smith, Lewis A. Binns, Albert Plambeck, Kevin Heidrich, "Overlay metrology at the crossroads," Proc. SPIE 6922, Metrology, Inspection, and Process Control for Microlithography XXII, 692203 (Mar. 22, 2008); doi: 10.1117/12.782035.
C. Thomsen, J. Strait, Z. Vardeny, H.J. Maris, and J. Tauc, "Coherent Phonon Generation and Detection by Picosecond Light Pulses," Physical Review Letters vol. 53, No. 10, Sep. 3, 1984, 4 pages.
C. Thomsen, H.T. Grahn, H.J. Maris, and J. Tauc, "Surface Generation and Detection of Phonons by Picosecond Light Pulses," Physical Review B, vol. 34, No. 6, Sep. 15, 1986, 10 pages.
Extended EP Search Report dated May 28, 2025 from EP Application No. 21895771.0-1211.

* cited by examiner

SYSTEM AND METHOD FOR PERFORMING ALIGNMENT AND OVERLAY MEASUREMENT THROUGH AN OPAQUE LAYER

CROSS REFERENCE TO RELATED APPLICATIONS

This application is a National Stage Entry filed under 35 U.S.C. 371 of PCT/US2021/060385, filed on Nov. 22, 2021, which claims priority to U.S. Provisional Application No. 63/117,443, filed Nov. 23, 2020, and entitled "A SYSTEM AND METHOD FOR PERFORMING AN OVERLAY MEASUREMENT THROUGH AN OPAQUE LAYER," both of which are assigned to the assignee hereof and are incorporated herein by reference in their entireties.

FIELD OF THE DISCLOSURE

Embodiments of the subject matter described herein are related generally to alignment and overlay measurement, and more particularly to the use of an opto-acoustic measurement for alignment and overlay measurement using a structure under an optically opaque layer.

BACKGROUND

Semiconductor processing for forming integrated circuits requires a series of processing steps. These processing steps include the deposition and patterning of material layers such as insulating layers, polysilicon layers, and metal layers. The material layers are typically patterned using a photoresist layer that is patterned over the material layer using a photomask or reticle. Typically, the photomask has alignment targets or keys that are aligned to fiduciary marks formed in the previous layer on the substrate. The overlay and alignment of a lithographically defined pattern on top of the underlying pattern is fundamental to device operation in all multi-layer patterned process flows. Misalignment between layers or patterns may lead to device failure.

There are various optical techniques and specially designed targets that are conventionally used for alignment and overlay measurements. For example, conventional imagining techniques may use specific wavelengths of light, e.g., ultraviolet (UV), visible, or infrared (IR), to image the underlying structures with which the overlying layer is to be aligned. However, in the fabrication of some structures, intervening optically opaque layers may be present. Optically opaque materials, such as found in semi-damascene process flow or after the processing of the magnetic tunnel junction (MTJ) of a magnetic random-access memory (MRAM), may be present between target structures, which presents particular challenges for alignment and overlay control. The presence of intervening opaque materials, for example, typically requires extra patterning operations thereby adding significant process cost. Alignment or overlay measurement of targets including intervening optically opaque materials is therefore desirable.

SUMMARY

A target for alignment or overlay includes top and bottom structures, but may include one or more optically opaque layer disposed between the top and bottom structures. The target may be measured using opto-acoustic metrology. A classifier library for the bottom structure is generated for classifying whether an opto-acoustic metrology data is obtained from locations on or off the bottom structure. A target under test may be measured by acquiring opto-acoustic measurement data for the bottom structure of the target and optically imaging the top structure. The location of the bottom structure may be determined using opto-acoustic metrology data acquired from the different locations over the bottom structure and the classifier library. The locations for acquisition of the data may be based on classification results of each measurement and a search pattern, and are used to locate edges of the bottom structure, from which the location of the bottom structure is known. The relative position of the top structure with respect to the bottom structure is determined using the opto-acoustically determined location of the bottom structure and the image of the top structure.

In one implementation, a method of non-destructive opto-acoustic metrology of a target on a sample is performed. The target includes an overlying structure and an underlying structure, and an optically opaque layer is disposed between the overlying structure and an underlying structure. A classifier library for the underlying structure that is below the optically opaque layer on a reference sample is obtained. The classifier library includes collected opto-acoustic metrology data for a plurality of locations of the underlying structure on the reference sample. Opto-acoustic metrology data is acquired for the underlying structure at different locations. A location of the underlying structure is determined using the opto-acoustic metrology data from the different locations and the classifier library for the underlying structure. An image of the overlying structure of the target is acquired. A relative position of the overlying structure with respect to the underlying structure can then be determined based on the location of the underlying structure determined using the opto-acoustic metrology data and the classifier library and a location of the overlying structure determined using the image of the overlying structure.

In one implementation, an apparatus may be configured for non-destructive acoustic metrology of a target on a sample, wherein the target includes an overlying structure and an underlying structure, and an optically opaque layer is disposed between the overlying structure and an underlying structure. The apparatus includes an opto-acoustic metrology device configured to acquire opto-acoustic metrology data for the underlying structure at different locations, an imaging device configured to image a sample, a stage for holding the sample and configured to move the sample with respect to the opto-acoustic metrology device, and at least one processor coupled to the opto-acoustic metrology device, the imaging device, and the stage. The at least one processor may be configured to obtain a classifier library for the underlying structure that is below the optically opaque layer on a reference sample, wherein the classifier library comprises collected opto-acoustic metrology data for a plurality of locations of the underlying structure on the reference sample. The at least one processor is further configured to acquire opto-acoustic metrology data from the opto-acoustic metrology device for the underlying structure at different locations. The at least one processor is further configured to determine a location of the underlying structure using the opto-acoustic metrology data from the different locations and the classifier library for the underlying structure. The at least one processor is further configured to acquire an image of the overlying structure of the target from the imaging device. The at least one processor is further configured to determine a relative position of the overlying structure with respect to the underlying structure based on the location of the underlying structure determined using the opto-acoustic metrology data and the classifier library and a location of the overlying structure determined using the image of the overlying structure.

In one implementation, an apparatus may be configured for non-destructive acoustic metrology of a target on a sample, wherein the target includes an overlying structure and an underlying structure, and an optically opaque layer is disposed between the overlying structure and an underlying structure. The apparatus includes a means for obtaining a classifier library for the underlying structure that is below the optically opaque layer on a reference sample, wherein the classifier library comprises collected opto-acoustic metrology data for a plurality of locations of the underlying structure on the reference sample. The apparatus further includes a means for acquiring opto-acoustic metrology data for the underlying structure at different locations and a means for determining a location of the underlying structure using the opto-acoustic metrology data from the different locations and the classifier library for the underlying structure. The apparatus further includes a means for acquiring an image of the overlying structure of the target, and means for determining a relative position of the overlying structure with respect to the underlying structure based on the location of the underlying structure determined using the opto-acoustic metrology data and the classifier library and a location of the overlying structure determined using the image of the overlying structure.

DETAILED DESCRIPTION

Figure 1A:
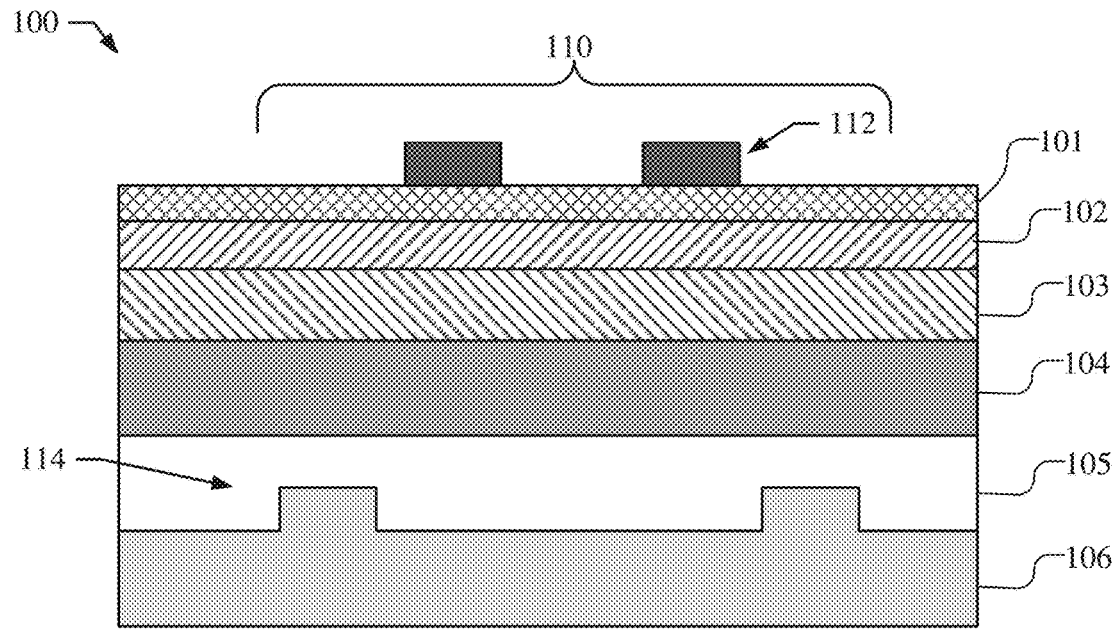
FIG. 1A illustrate an example of targets with top and bottom structures.

Fabrication of semiconductor and similar devices requires a series of processing steps in which layers, such as insulating layers, polysilicon layers, and metal layers, are deposited and patterned. For proper operation of such devices, proper overlay and alignment of successive layers is sometimes crucial. Accordingly, during the fabrication process, non-destructive metrology techniques are used to ensure proper alignment and overlay, using specially designed targets.

Targets used for alignment and overlay consist of structures assigned to each layer, e.g., a bottom layer and a top layer. A target may be imaged and the relative position of the top structure with respect to the bottom structure may be determined from the image. The relative positions of the top and bottom structures provide an indication of the alignment or overlay of their respective layers. To conventionally image a target, light having wavelengths that can penetrate the sample to the bottom layer is used. For example, depending on the material composition of the top layer, and any intervening layers between the top structure and the bottom structure, different wavelengths of light may be used, such as UV, visible or IR, so that the bottom layer may be resolved in the image.

The presence of optically opaque materials presents challenges for alignment and overlay. Optically opaque materials, such as metal layers, may be found in a semi-damascene process flow or after the processing of the magnetic tunnel junction (MTJ) of a magnetic random-access memory (MRAM), or other such devices. The presence of an intervening opaque layer between the top structure and the bottom structure of a target will prevent light from reaching the underlying structure, thereby causing the alignment or overlay measurement to fail.

As discussed herein, opto-acoustic measurements, such as picosecond laser acoustic (PLA) measurements, may be used for the measurement of alignment or overlay targets that including one or more intervening opaque layers between the top structure and the bottom structure of a target. The use of opto-acoustic measurements is advantageous as it does not rely on light to penetrate the opaque layers, but instead generates and detects acoustic waves that are capable of propagating through optically opaque layers. An opto-acoustic metrology device, such as PLA may use of an ultrafast laser (~100 fs pulse width) allowing resolution of a few fs. An opto-acoustic metrology device may include a retroreflector or mirror mounted on a voice coil with physical displacement of ~25 mm or 83.3 ps for achieving a short repeatable probe pulse time delay. With delay stage (ds) fixed, the voice coil could be operated in an absolute or relative (with fixed amplitude and a sinusoidal waveform) displacement mode. Additionally, the opto-acoustic metrology device may incorporate a secondary set of pump and probe beams for measurements. This may be achieved by including the rejected half of the modulated beams at the pump and probe electro-optic modulators (EOMs). By strategically placing the second set of beams the scan time can be cut in half with simultaneous measurements using both sets of beams.

In operation, the in-plane position of a structure under an opaque layer with respect to a structure visible on the top surface with the defined in-plane spatial coordinate (e.g. the center of the structure, a corner, etc.) may be determined using an opto-acoustic metrology device. The top structure position may be determined by optical imaging methods. The position of the buried structure may be derived from the opto-acoustic measurement data. By way of example, the data collection and analysis process may include (but is not limited to) localized mapping, edge detection, triangulation, etc.

The mapping method, for example, may use a local raster scan of opto-acoustic measurements in the approximate region of the underlying structure. The throughput of the mapping method is dictated by the number of sites and the extent, resolution, and number of sweeps collected at each site. Using acoustic information, the appropriate time delay plane containing the relevant image information to determine the position of the structure can be defined with a temporal scan limited to, e.g., less than 50 ps, based on knowledge of the device parameters, e.g., layout and film stack information (including the approximate opaque layer material and thickness). Using the entire time delay span, the raw acoustic data, its Fourier transform, or the thermal background, or a combination thereof, may be used alone or in conjunction with a principle component analysis (PCA) algorithm to form an image of the structure from which the position of the underling structure may be derived. Additionally or alternatively, a non-PCA analysis may be used to identify a localized region in frequency space that captures the signal difference between regions on and off the underlying structure and to seek a highly correlating localized region in temporal space.

Due to local topography and film thickness variation, localization in time delay may have poor capability preventing a faster scan. Accordingly, the opto-acoustic metrology device may collect data at a fixed ds position with a fixed amplitude (1.5 mm) sinusoidal oscillation at a frequency (10 KHz) of the retroreflector on the voice coil yielding a delay of +/−5 ps. With the time constant optimized on the lock-in amplifier for the sinusoidal oscillation the voltage output would then be the average of the change in reflectivity over the selected time delay range mitigating the noted concern of operating at a fixed ds position.

Edge finding or triangulation methods for the underlying structure may rely on having an approximate fingerprint of the opto-acoustic measurement signature on and off the underlying structure. The opto-acoustic measurement data may be used to build a classification library or neural network that is capable of recognizing the state of the position with respect to an underlying structure. For example, an initial opto-acoustic measurement may be made at a given position. After an opto-acoustic measurement, the classification library may be used to determine whether the current position for an opto-acoustic measurement is on or off the underlying structure, and additional opto-acoustic measurements are acquired at new positions dictated by a predefined search pattern or algorithm. A finite number of subsequent opto-acoustic measurements would be needed for edge finding or triangulation to accurately determine the location of the underlying structure.

FIG. 1A illustrates one example of film stack 100 that includes a target 110 that includes a top structure 112 that is patterned on a top layer 101 and a bottom structure 114 that is patterned on an underlying layer 106. The top structure 112, for example, may be patterned photoresist or a hard mask, that is patterned along with other structures (not shown) on the top layer 101 of the stack 1100. The bottom structure 114 may be patterned on the underlying layer 106, which by way of example may be silicon. The relative position of the top structure 112 with respect to the bottom structure 114 provides the alignment or overlay measurement between the patterns on the top layer 101 with respect to the underlying layer 106.

The top layer 101 in the present example, may be an anti-reflection coating. A number of intervening layers 102-105 may be present between the top layer 101 and the underlying layer 106. For example, a dielectric layers 102 and 103 may overlie a poly-silicon layer 104, which overlies a silicon dioxide layer 105. Each of the intervening layers 102-105 is at least partially transparent to optical wavelengths. Moreover, the total thickness of the film stack 100 between the top layer 101 and the underlying layer 106 is small enough to enable light propagation through the film stack 100 to the underlying layer 106 and back. Typically, for example, conventional targets 100 are limited to less than approximately 1 μm between the top layer 101 and the underlying layer 106.

Figure 1B:
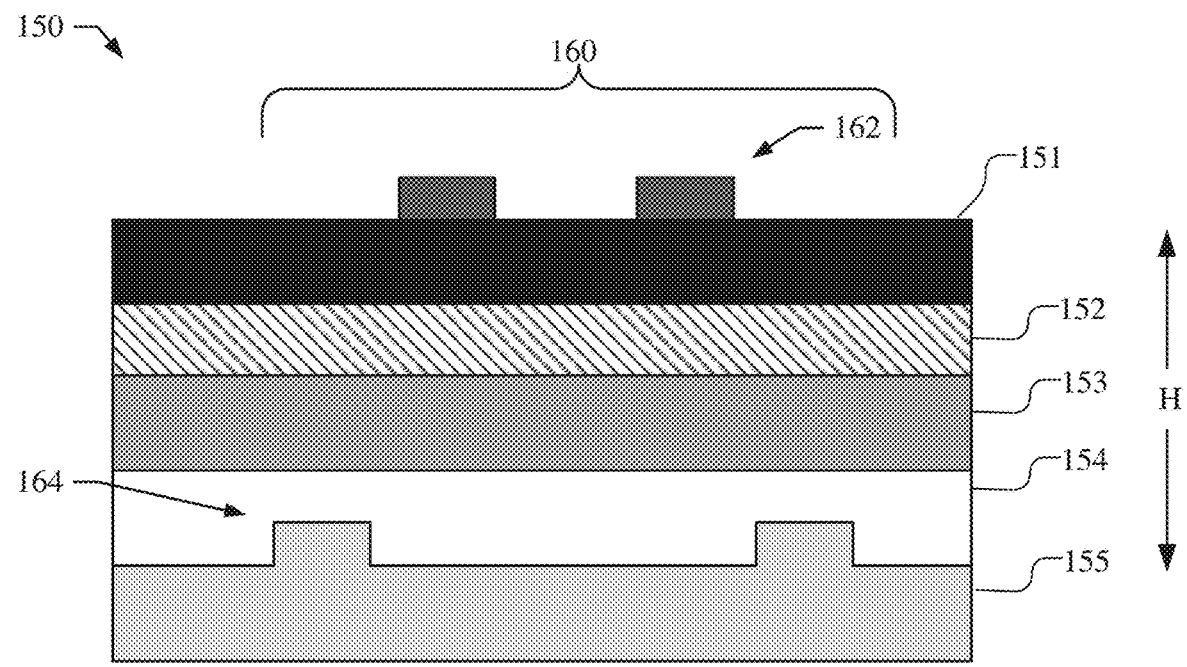
FIG. 1B illustrate an examples of a target with top and bottom structures and an intervening optically opaque layer between the top and bottom structures.

FIG. 1B, on the other hand, illustrates an example of film stack 150 that includes a target 160 with an intervening optically opaque layer between the top structure 162 and a bottom structure 164 of the target 160. Similar to target 110 shown in FIG. 1A, target 160 may include the top structure 162 of patterned photoresist or a hard mask, that is patterned along with other structures (not shown) on the top layer 151. The bottom structure 164 may be patterned on the underlying layer 155, which by way of example may be silicon. The relative position of the top structure 162 with respect to the bottom structure 164 provides the alignment or overlay measurement between the patterns on the top layer 151 and the underlying layer 155.

The top layer 151 in the present example, may be an optically opaque metal layer, and similar to film stack 100 shown in FIG. 1A, a number of intervening layers 152-154 may be present between the top layer 151 and the underlying layer 156. For example, a dielectric layer 152 may overlie a poly-silicon layer 153, which overlies a silicon dioxide layer 154. The top layer 151, for example, may be a metal layer that is 50-100 nm thick and optically opaque, thereby preventing conventional optical techniques from being used to determine the position of the bottom structure 164, and thus, preventing the measurement of the alignment or overlay of the patterns on the top layer 151 with respect to the bottom layer 155.

In some implementations, the film stack 150 may have multiple opaque layers. In some implementations, the film stack 150 may not have a single opaque layer, but may have a large total thickness H between the top layer 151 and the underlying layer 155 that renders the film stack 100 optically opaque. In some implementations, the film stack 150 may include both opaque, e.g., metal, layers, and may have a thickness H that renders conventional optical metrology inadequate to detect the position of the bottom structure 164. By way of example, in some implementations, an opaque layer, e.g., a metal layer, may be used as a transducer for launching acoustic waves for an opto-acoustic metrology device. The film stack 150 may have a thickness greater than 1 μm, for example, up to 35 μm or more. One application, for example, would be to align of a thinned Si die (50-100 μm) to a substrate or carrier wafer in a 3D bonding process flow, which may have a separation between the top and bottom layer of 50-100 µm. Another relevant operation may be alignment between tier stacks of 3D NAND process flow, which may have a separation between 5-10 µm.

Figure 2:
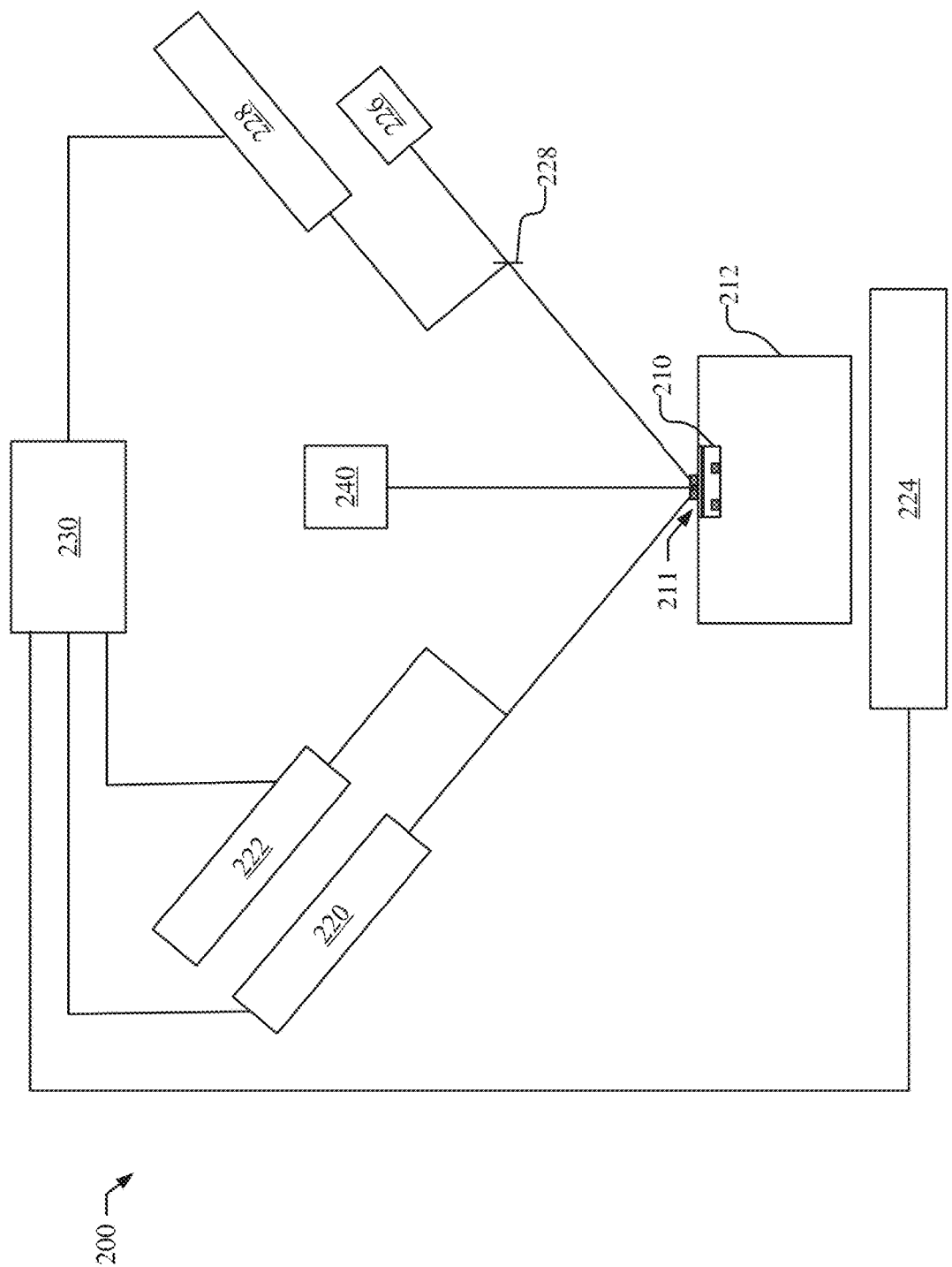
FIG. 2 illustrates a schematic representation of an example opto-acoustic metrology system that may measure an underlying structure of a target below one or more optically opaque layers.

FIG. 2 illustrates a schematic representation of an example opto-acoustic metrology device 200 that may measure an underlying structure of a target below one or more optically opaque layers, as discussed herein. In general, the device 200 includes a pump laser 220 (also referred to herein as a excitation laser); a probe laser 222 (also referred to herein as a detection laser); optics including lenses, filters, polarizers and the like (not shown) that direct radiation from the pump and probe lasers 220, 222 to a film stack 210 that includes the target 211; a mechatronic support 224 for a substrate/sample 212 of which film stack 210 is a part, the mechatronic support 224 being adapted to move the substrate 212 relative to the pump and probe lasers 220, 222 to obtain measurements from multiple positions; a beam dump 226 for capturing radiation from the pump laser returned from the film stack 210; a sensor 228 adapted to sense an intensity of radiation from the probe laser 222 that is returned from the film stack 210; and, a controller 230 coupled to the probe and pump lasers 220, 222, the mechatronic support 224, and the sensor 228.

It should be appreciated that the controller 230 may be a self-contained or distributed computing device capable of performing necessary computations, receiving, and sending instructions or commands and of receiving, storing, and sending information related to the metrology functions of the device.

In the depicted embodiment the pump and probe lasers 220, 222 in the embodiment of the opto-acoustic metrology device 200 shown in FIG. 2 can share at least a portion of an optical path to and from the film stack 210. For example, the lasers can have a number of different relative arrangements including a configuration wherein the paths are the same, partially overlapping, adjacent, or coaxial. In some implementations, the pump and probe beams may be derived from the same pulsed laser. In other embodiments, the pump and probe lasers 220, 222 and the beam dump 226 and sensor 228 do not share optical paths. Preferably, the pump and probe lasers 220, 222 may be controlled directly so as to obtain the necessary temporal spacing between the pulses of light directed to the film stack 210.

It should be appreciated that many optical configurations are possible. In some configurations the pump can be a pulsed laser with a pulse width in the range of several hundred femtoseconds to several hundred nanoseconds and the probe beam is a continuous wave beam coupled to an interferometer or beam deflection system. For example, in systems wherein the probe is pulsed the device can employ a delay stage (not shown) for increasing or decreasing the length of the optical path between the laser and the film stack 210 associated therewith. The delay stage, where provided, would be controlled by controller 230 to obtain the necessary time delays in the light pulses that are incident on the object. Many other alternative configurations are also possible. On other embodiments, the device does not include a delay stage. It should be appreciated that the schematic illustration of FIG. 2 is not intended to be limiting, but rather depict one of a number of example configurations for the purpose of explaining the new features of the present disclosure.

In operation, the opto-acoustic metrology device 200 directs a series of pulses of light from pump laser 220 to the film stack 210. These pulses of light are incident (i.e., at an angle which can be any angle between zero to 90 degrees including, for example, 45 degrees and 90 degrees) upon and at least partially absorbed by a transducer layer in the film stack 210. The absorption of the light by the transducer layer causes a transient expansion in the material of the film stack 210. The expansion is short enough that it induces what is essentially an ultrasonic wave that propagates vertically through the film stack 210, and is reflected at each underlying interface in the film stack and returned to the top surface. Light from the pump laser 220 that is reflected from the film stack 210 is passed into a beam dump 226 which extinguishes or absorbs the pump radiation.

In addition to directing the operation of the pump laser 220, the controller 230 directs the operation of the probe laser 222. Probe laser 222 directs radiation in a series of light pulses that is incident on the film stack 210, which reflect from the top layer of the film stack 210 and is affected by the reflected ultrasonic waves they return to the top surface of the film stack 210. The light reflected from the surface of the film stack 210 is directed from the film stack 210 to the sensor 228 by means of beam splitter 229. The reflectivity of the reflected light, for example, at the top surface is altered due to changes in reflectivity or surface deformation due to the reflected ultrasonic waves returning at the top surface. Where there are transparent layers, the reflected light may interfere constructively and destructively as the ultrasonic wave propagates producing interference oscillations. The sensor 228 may be adapted to sense a change in the intensity of the probe beam of light caused by the changes in reflectivity and/or interference oscillations.

The spot sizes of the pump and probe beams may vary based upon the particular target to be measured. The spot sizes of the respective beams may be similar or dissimilar. The spot size of the respective beams may, for example, range from around 100 µm to approximately the wavelength diffraction limit of the optical device used to carry out the optical acoustic metrology process, i.e., to less than 1 µm. The spot size of the laser can be in part based upon the size of the structure being measured or upon a balance between signal strength and thermal budget of the sample under test.

In addition, the opto-acoustic metrology device 200 is coupled with an imaging device 240 that is configured to image the top structure on the film stack. The imaging device 240, for example, may be the navigation channel camera. The imaging device 240 may perform optical imaging of the target 211. Due to one or more opaque layers in the target 211, however, the optical image of the target 211 produced by the imaging device 240 may include only the top structure, as discussed herein.

Figure 3:
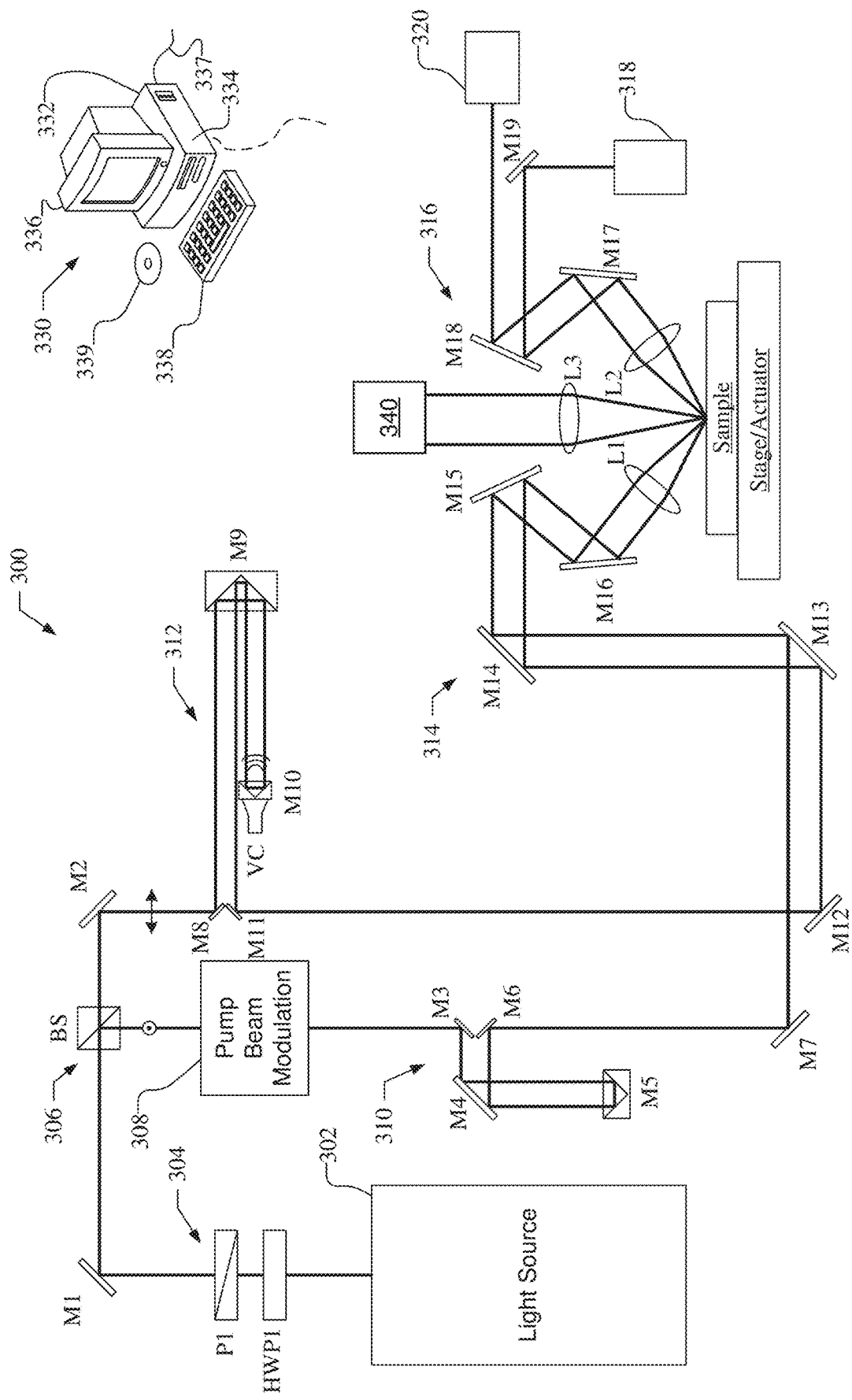
FIG. 3 illustrates a more detailed schematic representation of an example opto-acoustic metrology system that may measure an underlying structure of a target below one or more optically opaque layers.

FIG. 3 illustrates a schematic representation of an example opto-acoustic metrology device 300 that may measure an underlying structure of a target below one or more optically opaque layers, as discussed herein. As illustrated, light may be produced from a light source 302, such as a 520 nm, 200 fs, 60 MHz laser. The light is directed through an intensity control 304, including a half wave plate HWP1 and a polarizer P1, and directed by mirror M1 to pump probe separator 306, which may include a polarizing beam splitter BS and mirror M2. The pump beam passes through a pump beam modulator 308, e.g., an electro-optic modulator (EOM), and a pump delay 310 that includes mirrors M3, M4, M5, and M6, before being directed to a pump beam steerer, e.g., mirror M7 which is attached to a piezoelectric motor to adjust the position of the mirror M7 and thus the direction of the pump beam. After the pump probe separator 306, the probe beam is directed to a probe variable delay 312 that includes mirrors M8, M9, M10, and M11, where mirror M10 moves to adjust the delay in the probe beam. The mirror M10 may be a retroreflector or mirror coupled to a voice coil VC with a physical displacement of, e.g., approximately 25 mm or 83.3 ps for achieving a short repeatable probe pulse time delay. With variable delay 312 from the delay stage (ds) fixed, the voice coil VC may be operated in an absolute or relative (with fixed amplitude and a sinusoidal waveform) displacement mode. For example, due to local topography and film thickness variation, localization in time delay may have poor capability preventing a faster scan. Data may be collected at a fixed ds position with a fixed amplitude (1.5 mm) sinusoidal oscillation at a frequency (10 KHz) of the retroreflector M10 on the voice coil VC yielding a delay of +/−5 ps. With the time constant optimized on the lock-in amplifier (not shown) for the sinusoidal oscillation, the voltage output may then be the average of the change in reflectivity over the selected time delay range mitigating the noted concern of operating at a fixed ds position.

The probe beam, after the probe variable delay 312 is directed to probe beam steerer 314, e.g., mirror M12, which is attached to a piezoelectric motor to adjust the position of the mirror M12 and thus the direction of the probe beam. The pump and probe beams are directed by mirror M13 to a focusing unit 314, which is illustrated as including mirrors M14, M15, and M16 and lens L1, to the beams on the film stack on the sample 301. The reflected beams are received by a receiving unit 316, which is illustrated as including lens L2 and mirrors M17 and M18. The receiving unit 316, e.g., directs the reflected pump beam to a beam dump 318 via mirror M19, and directs the reflected probe beam to a detector 320, which performs lock in detection for reflectivity and deflection. The detector 320 may include, e.g., a polarization state detector with encoder and detector.

In addition, the opto-acoustic metrology device 300 is coupled with an imaging device 340 and one or more lenses L3 that is configured to image the top structure of the target on the film stack on the sample. The imaging device 340, for example, may be the navigation channel camera.

The sample 301 is held on a stage 303 that includes or is coupled to one or more actuators configured to move the sample 301 relative to the optical system of the opto-acoustic metrology device 300 so that various locations on the sample 301 may be measured. In the depicted embodiment, the device may include additional components and subsystems, such as beam management and conditioning components, such as beam expanders, collimators, polarizers, half-wave plates, etc., as well as a beam power detector, and a height detector. Those having skill in the art will appreciate variations of the devices depicted in FIGS. 2 and 3 that would still be suitable to carry out the opto-acoustic metrology techniques described herein.

The detector 320, as well as other components of the opto-acoustic metrology device 300, such as the light source 302, probe variable delay 312, stage/actuator 303 upon which the sample 301 is held may be coupled to at least one processor 330, such as a workstation, a personal computer, central processing unit or other adequate computer system, or multiple systems. It should be understood that one processor, multiple separate processors or multiple linked processors may be used, all of which may interchangeably be referred to herein as processor 330, at least one processor 330, one or more processors 330. The processor 330 is preferably included in, or is connected to, or otherwise associated with opto-acoustic metrology device 300. The processor 330, for example, may control the positioning of the sample 301, e.g., by controlling movement of the stage 303 on which the sample 301 is held. The stage 303, for example, may be capable of horizontal motion in either Cartesian (i.e., X and Y) coordinates, or Polar (i.e., R and θ) coordinates or some combination of the two. The stage 303 may also be capable of vertical motion along the Z coordinate. The processor 330 may further control the operation of a chuck on the stage 303 used to hold or release the sample 301. The processor 330 may also collect and analyze the data obtained from the detector 320 and imaging device 340. The processor 330 may analyze the opto-acoustic metrology data to determine a location of a bottom structure of target, which may be below one or more optically opaque layers, and may further analyze the imaging data to determine a location of the top structure of the target, from which the relative position of the top structure with respect to the bottom structure may be determined from which the alignment or overlay may be determined, as discussed herein. For example, the processor 330 may use the measured data for localized mapping of the bottom structure, e.g., using a local scan of the approximate region of the bottom structure to generate acoustic information. Using the raw opto-acoustic metrology data, or processed data, such as its Fourier transform, or the thermal background, or a combination thereof, an image of the structure from which the position of the underling structure may be derived. In some implementations, a principle component analysis (PCA) process may be used with the data to form an image of the bottom structure. Additionally or alternatively, a non-PCA analysis may be used to identify a localized region in frequency space that captures the signal difference between regions on and off the underlying structure and to seek a highly correlating localized region in temporal space. The processor 330 may alternatively or additionally process the opto-acoustic metrology data for edge detection or triangulation, e.g., using a classification library or neural network generated by the opto-acoustic metrology device 300 (or another device) on a reference sample. The classification library, for example, is built based on the opto-acoustic measurement data that is collected from locations on and off the bottom structure of a reference target. The classification library (or neural network) may be used with one or more opto-acoustic measurements at locations at the approximate region of the bottom structure to determine whether each location is on or off the bottom structure. Additional opto-acoustic measurements may be acquired at new positions and compared to the classification library as dictated by a predefined search pattern or algorithm until one or more edges of the bottom structure are located, from which the position of the bottom structure may be determined.

The processor 330, which includes at least one processing unit 332 with memory 334, as well as a user interface including e.g., a display 336 and input devices 338. A non-transitory computer-usable storage medium 339 having computer-readable program code embodied may be used by the processor 330 for causing the at least one processor to control the opto-acoustic metrology device 300 and to perform the functions including the analysis described herein. The data structures, classification library, software code, etc., for automatically implementing one or more acts described in this detailed description can be implemented by one of ordinary skill in the art in light of the present disclosure and stored, e.g., on a computer-usable storage medium 339, which may be any device or medium that can store code and/or data for use by a computer system such as processing unit 332. The computer-usable storage medium 339 may be, but is not limited to, flash drive, magnetic and optical storage devices such as disk drives, magnetic tape, compact discs, and DVDs (digital versatile discs or digital video discs). A communication port 337 may also be used to receive instructions that are used to program the processor 330 to perform any one or more of the functions described herein and may represent any type of communication connection, such as to the internet or any other computer network. The communication port 337 may further export signals, e.g., with alignment or overlay measurement results and/or instructions, to another system, such as external process tools, in a feed forward or feedback process in order to adjust a process parameter associated with a fabrication process step of the samples based on the measurement results. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described. The results from the analysis of the data may be stored, e.g., in memory 334 associated with the sample and/or provided to a user, e.g., via display 336, an alarm or other output device. Moreover, the results from the analysis may be fed back to the process equipment to adjust the appropriate patterning step to compensate for any detected mis-alignments or overlay errors in the multiple patterning process.

Figure 4:
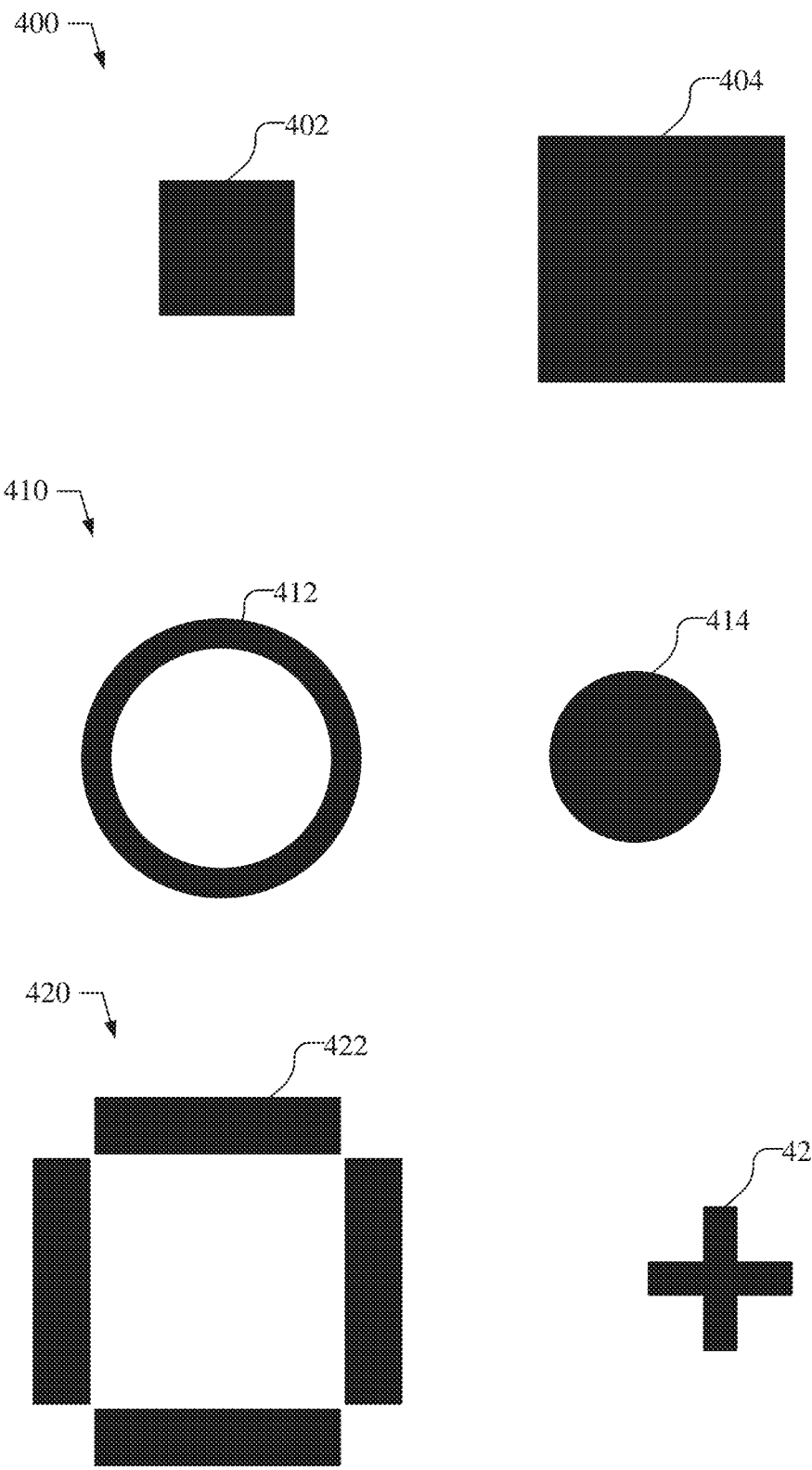
FIG. 4 illustrates different examples of targets, including top structures and bottom structures.

FIG. 4 illustrates different examples of targets, including top structures and bottom structures, that may be used for alignment or overlay, even with the presence of an intervening optically opaque layer, as discussed herein. By way of example, target 400 is illustrated as including a square top structure 402 and a square bottom structure 404. Target 410 is illustrated as including an annular top structure 412 and a circular bottom structure 414. Target 420 is illustrated as including a box top structure 422 and a cross bottom structure 424. Various other shapes and arrangements of structures may be used.

In operation, the in-plane position of the bottom structure under an opaque layer may be determined with respect to a top structure that is visible on the top surface using an opto-acoustic metrology device, such as device 200 shown in FIG. 2 or device 300 shown in FIG. 3. The top structure position may be determined by optical imaging methods, while the position of the bottom structure may be derived from the opto-acoustic measurement data. By way of example, the data collection and analysis process may use localized mapping.

The mapping method, for example, may use a local scan, such as a raster scan, of opto-acoustic measurements in the approximate region of the underlying structure. Using the entire time delay span, the raw acoustic data, its Fourier transform, or the thermal background, or a combination thereof, may be used alone or in conjunction with a principle component analysis (PCA) algorithm to form an image of the structure from which the position of the underling structure may be derived.

Figure 5:
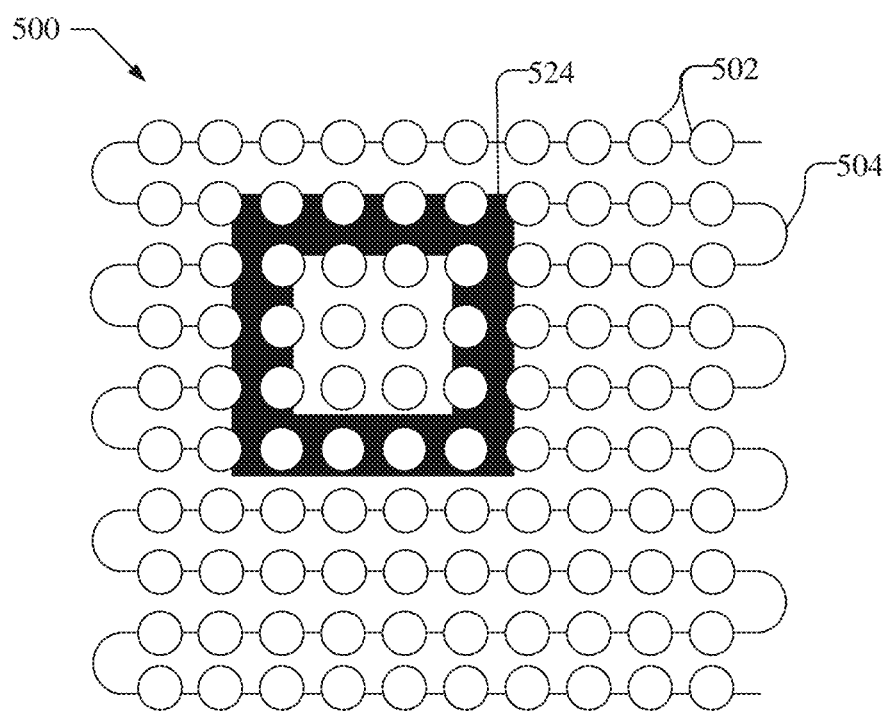
FIG. 5 illustrates scanning the bottom structure to collect opto-acoustic metrology data from a number of locations over the bottom structure.

FIG. 5, by way of example, illustrates a raster scan of a bottom structure 524 with to collect opto-acoustic metrology data from a number of locations to find the bottom structure 524 of a target under test. The collection of opto-acoustic metrology data is illustrated as measurement spots 502 that are generated by scanning the bottom structure 524, as illustrated by lines 504.

A PCA analysis or other similar type of analysis of the opto-acoustic metrology data, such as Independent Component Analysis (ICA), Partial Least Squares (PLS), may be used to form an image of the bottom structure.

Figure 6:
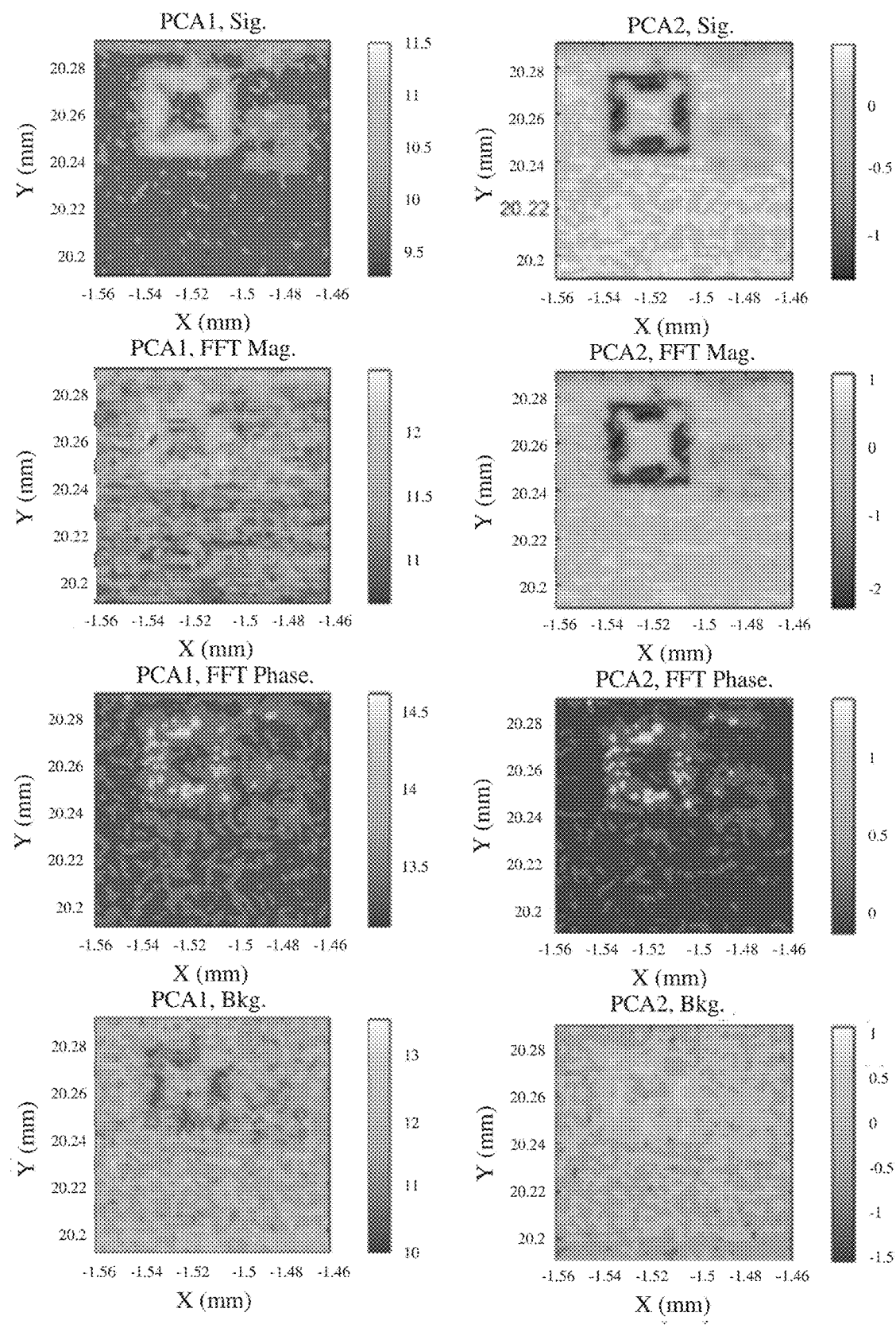
FIG. 6 illustrates data analysis in time and frequency of collected opto-acoustic metrology data from a number of locations over a bottom structure to generate a spatial image of the bottom structure.

FIG. 6, by way of example, illustrates PCA data analysis in time and frequency for a 50 ps span, and illustrates two principle components of the raw signature, FFT magnitude, FFT phase, and background. The results include a $2^{nd}$ order polynomial background and the FFT padded to 0.5 GHz resolution. As can be seen in FIG. 6, the buried bottom structure may be resolved using PCA analysis of the opto-acoustic metrology data.

Figure 7:
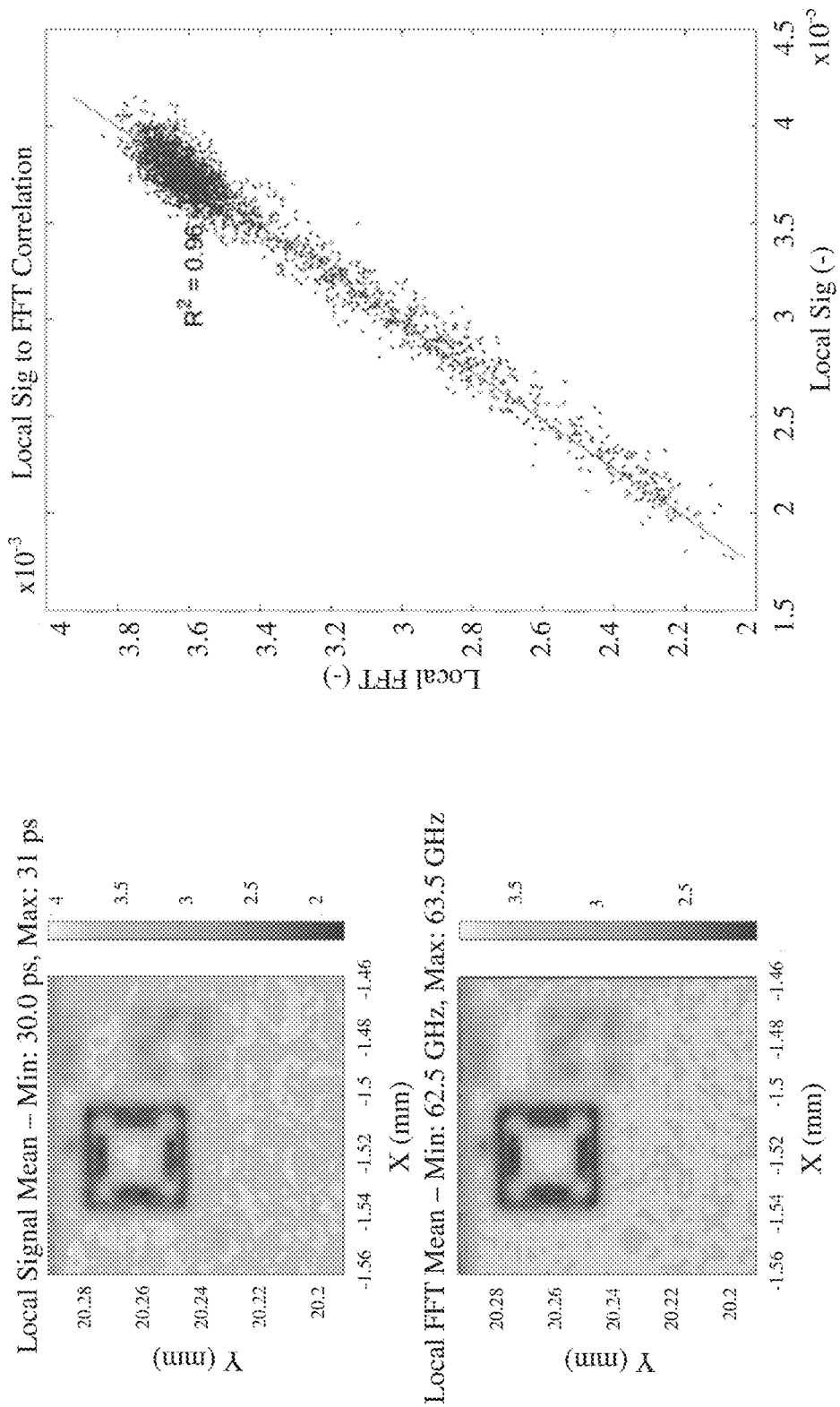
FIG. 7 illustrates the localized data analysis in time (1 ps) and frequency (1 GHz), and the local signature to FFT correlation.

FIG. 7, by way of example, illustrates the localized data analysis in time (1 ps) and frequency (1 GHz), and the local signature to FFT correlation.

Additionally or alternatively, a non-PCA analysis may be used to identify a localized region in frequency space that captures the signal difference between regions on and off the underlying structure and to seek a highly correlating localized region in temporal space.

Figure 8:
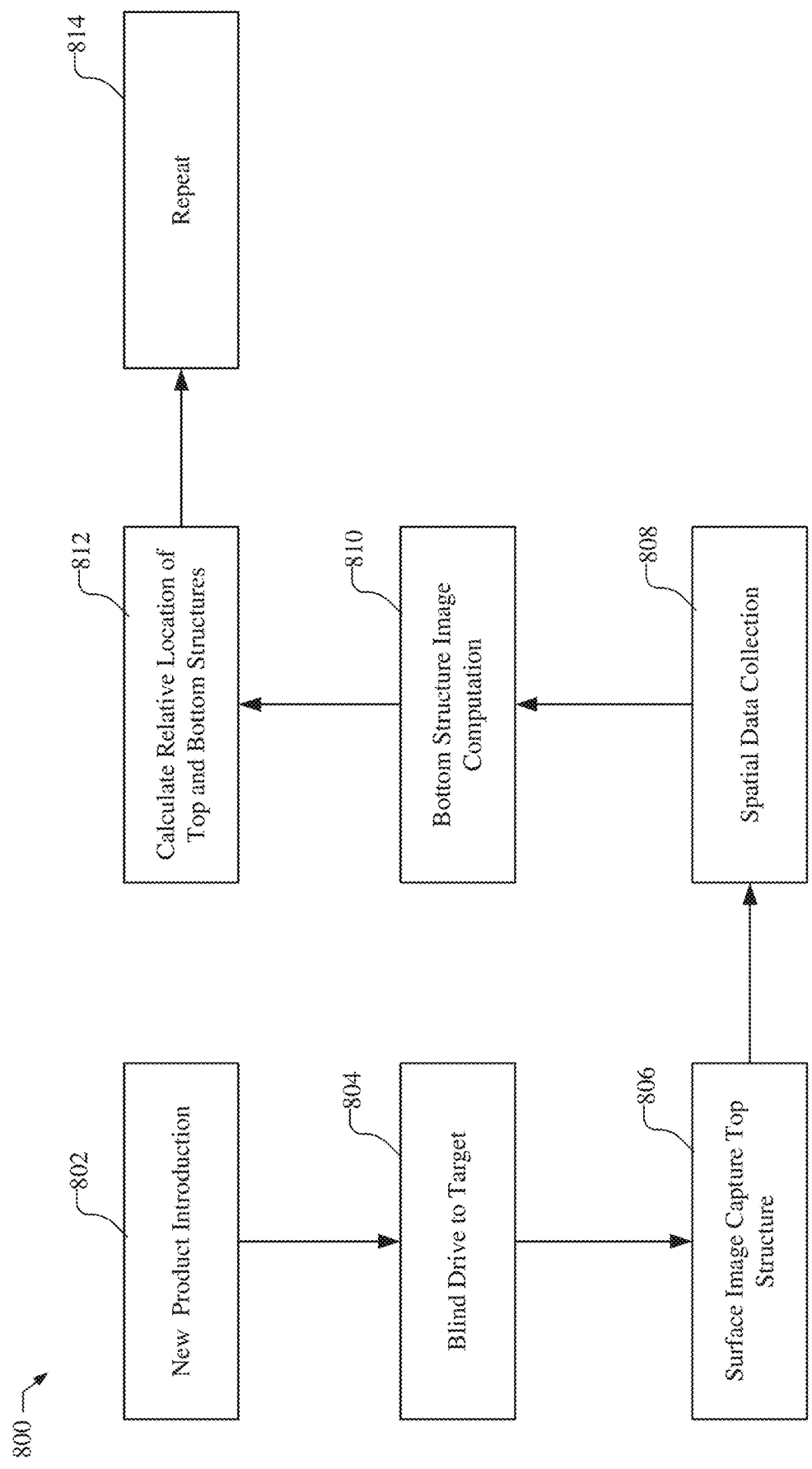
FIG. 8 illustrates an example of a process for determining alignment or overlay for a sample with a target using opto-acoustic metrology using a spatial image generated from collected opto-acoustic metrology data.

FIG. 8 illustrates an example of a process 800 for determining alignment or overlay for a sample with a target using opto-acoustic metrology. The process, for example, may performed using opto-acoustic metrology device 200 shown in FIG. 2 or opto-acoustic metrology device 300 shown in FIG. 3.

At block 802, a new product introduction is performed in which the layout and details of the structure, e.g., the target, are obtained. The structure details for the target, for example, may include the position, dimensions, materials, etc. of the target, as well as the presence of any optically opaque material between the top structure of the target and the bottom structure of the target, and the target thickness.

At block 804, for example, a blind drive is performed to position sample under test with respect to the opto-acoustic metrology device so that the approximate location of a target to be measured is aligned with the optical system.

At block 806, a surface image capture is performed to generate an image of the top structure of the target. The image of the top structure of the target, for example, may be collected using the navigation channel camera.

At block 808, spatial data collection is performed. For example, as illustrated in FIG. 5, opto-acoustic metrology data is acquired at a number of locations over the bottom structure. The collection of data, for example, may be performed by scanning the bottom structure, e.g., using a defined mesh with a connected path, such as a raster scan.

At block 810, the opto-acoustic metrology data collected at stage 808 is processed, e.g., using PCA, ICA, PLS, etc. to produce a two-dimensional spatial image of the bottom structure. For example, as illustrated in FIG. 6, the raw opto-acoustic metrology data, FFT magnitude, FFT phase, or background, or a combination thereof may be processed to generate a spatial image of the bottom structure.

At block 812, the alignment of the target structures may be calculated using the optical image of the top structure, obtained, e.g., at block 806, and the spatial image of the bottom structure generated using opto-acoustic metrology data at block 810. In some implementations, the relative position of the top structure with respect to the bottom structure may be determined in the XY coordinate system. The alignment of the top and bottom structures may be calculated based on respective centers of the structures or based on distance between edges on the top structure with respect to edges on the bottom structure, or in any other desired manner. The alignment of the top structure with respect to the bottom structure provides the measurement of overlay error between the layer that includes top structure and the layer that includes the bottom structure.

At block 814, the process may be repeated for additional targets on the sample, e.g., by repeating the process at block 804 for a different target on a current die or on a different die. If a new product is introduced, the process may repeat beginning at block 802.

Figure 9:
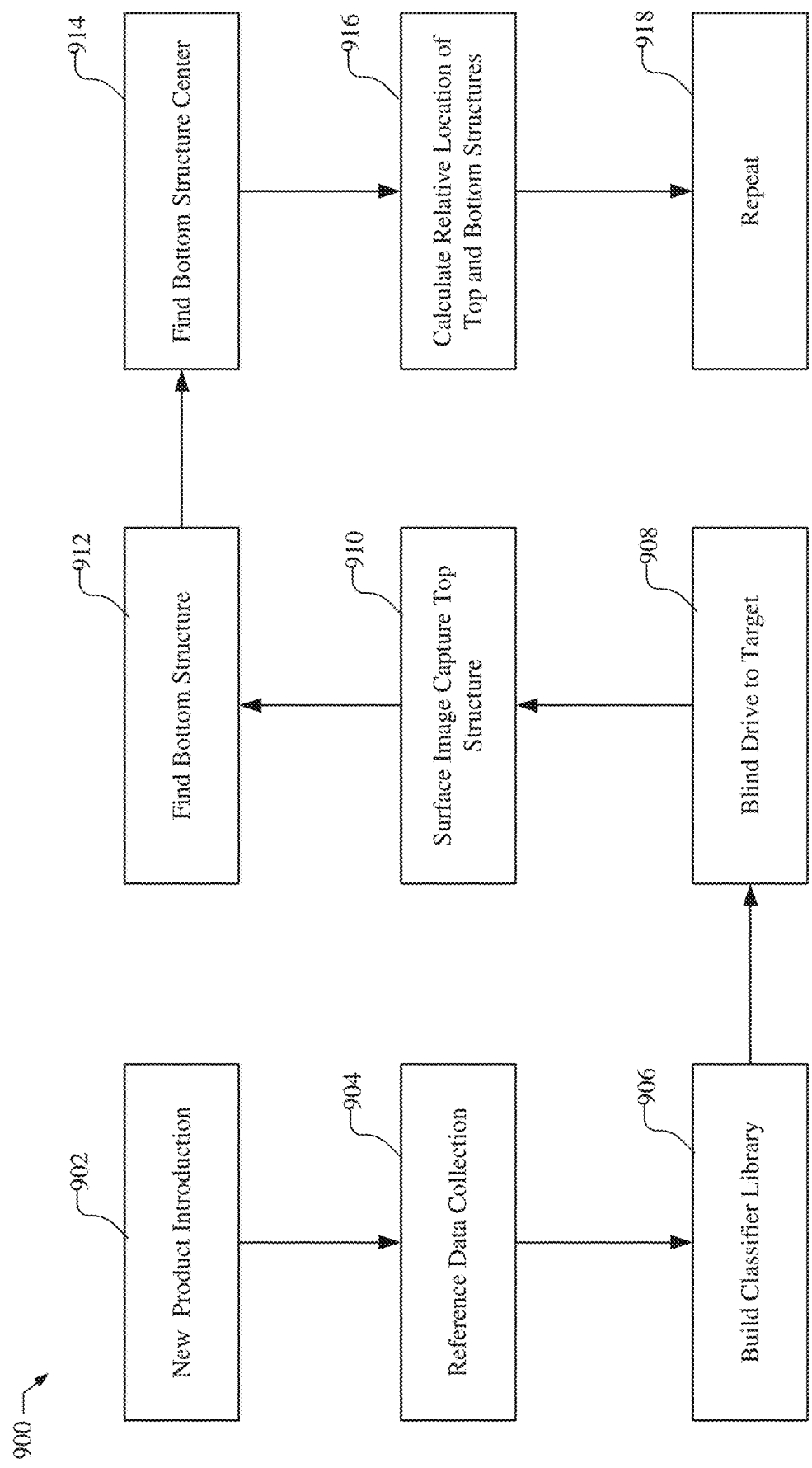
FIG. 9 illustrates an example of a process for determining alignment or overlay for a sample with a target using opto-acoustic metrology and a classifier library to search for and locate the bottom structure.

FIG. 9 illustrates an example of a process 900 for determining alignment or overlay for a sample with a target using opto-acoustic metrology. The process, for example, may performed using opto-acoustic metrology device 200 shown in FIG. 2 or opto-acoustic metrology device 300 shown in FIG. 3.

At block 902, a new product introduction is performed in which the layout and details of the structure, e.g., the target, are obtained. The structure details for the target, for example, may include the position, dimensions, materials, etc. of the target, as well as the presence of any optically opaque material between the top structure of the target and the bottom structure of the target, and the target thickness.

At block 904, opto-acoustic metrology data is collected from the bottom structure of a reference target. The opto-acoustic metrology data is collected from locations where the measurement spot is on the bottom structure of the reference target and off the bottom structure of a reference target.

Figure 10:
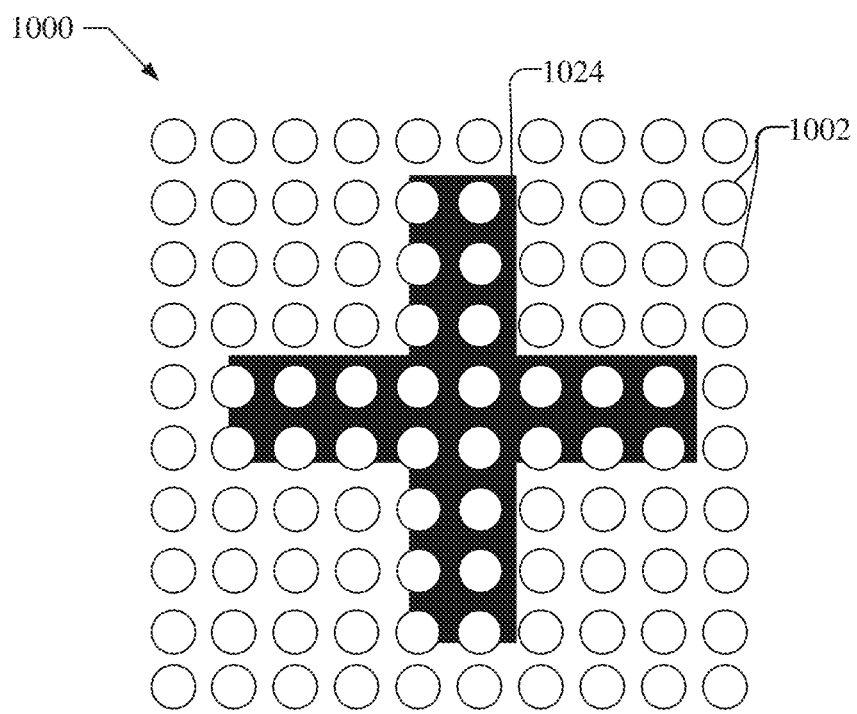
FIG. 10 illustrates the collection of opto-acoustic metrology data from a plurality of locations that are on and off the bottom structure of a reference target to generate a classifier library.

FIG. 10, by way of example, illustrates the collection of opto-acoustic metrology data from a plurality of locations that are on and off the bottom structure 1024 of a reference target. The bottom structure 1024 of the reference target, for example, is similar to the bottom structure 424 shown in FIG. 4. The collection of opto-acoustic metrology data from a plurality of locations is illustrated as a plurality of measurement spots 1002 some of which are on the bottom structure 1024, some of which are partially on the bottom structure 1024, and some of which are off the bottom structure 1024. It should be understood that the bottom structure 1024 is buried under one or more intervening layers, including one or more optically opaque layers, and the measurement spots 1002 are incident on the top of the target. Accordingly, there may be one or more intervening layers between each measurement spot 1002 and the bottom structure 1024.

At block 906 of FIG. 9, a classifier library is built using the opto-acoustic metrology data collected from the plurality of locations on and off the bottom structure of the reference target. The opto-acoustic metrology data collected from the plurality of locations, by way of example, functions as a fingerprint of the data on and off the bottom structure. Whether the data is collected from a location that is on the bottom structure or off the bottom structure may be determined, e.g., using a data analysis of the scanned data, such as discussed in reference to FIGS. 5 and 6. Once the classifier library is built, the opto-acoustic metrology device may be used to determine the location of a bottom structure of a target on a sample under test.

At block 908, for example, a blind drive is performed to position sample under test with respect to the opto-acoustic metrology device so that the approximate location of a target to be measured is aligned with the optical system.

At block 910, a surface image capture is performed to generate an image of the top structure of the target. The image of the top structure of the target, for example, may be collected using the navigation channel camera.

At block 912, the bottom structure of the target is found using opto-acoustic metrology data. For example, opto-acoustic metrology data is acquired from an initial location and the classifier library is used to classify the result as on or off (or partially on) the bottom structure of the target. The target may then be moved with respect to the optical system to a new location and the opto-acoustic metrology data is collected from the new location. The classifier library is used to classify the new result as on or off (or partially on) the bottom structure of the target. The process may be repeated, moving the target in a pre-defined search pattern, such as a spiral search, until the target is found. The pre-defined search pattern, for example, may be based on the shape of the bottom structure.

Figure 11:
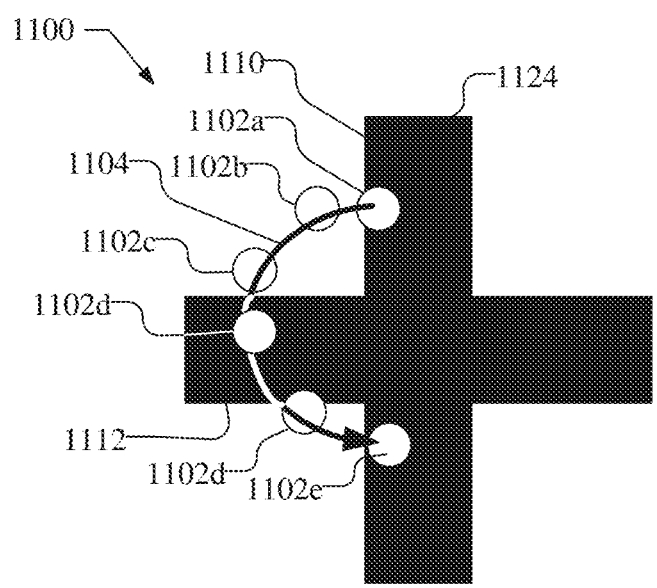
FIG. 11 illustrates the collection of opto-acoustic metrology data from a number of locations to determine the location of a bottom structure of the target under test.

FIG. 11, by way of example, illustrates the collection of opto-acoustic metrology data from a number of locations to find the bottom structure 1124 of the target under test. The bottom structure 1124 of the target, for example, is similar to the bottom structure 424 and 1024 shown in FIGS. 4 and 10, respectively. The collection of opto-acoustic metrology data is illustrated as measurement spots 1102a-1102e (collectively referred to as measurement spots 1102). The collection of opto-acoustic metrology data from a first location, e.g., at measurement spot 1102a, is compared to the classifier library to classify the result as on or off (or partially on) the bottom structure 1124 of the target. The target is then moved, as illustrated by arrows 1104 to new location, e.g., measurement spot 1102b, and additional opto-acoustic metrology data is collected and compared to the classifier library to classify the result as on or off (or partially on) the bottom structure 1124 of the target. The process is repeated, e.g., until one or more edges of the bottom structure 1124 are located, from which the location of the bottom structure 1124 may be determined. For example, with the bottom structure 1124 shown in FIG. 11, an edge 1110 extending in the Y direction and an edge 1112 extending in the Y direction may be located using the measurement spots 1102. The movement of the target may be in a pre-defined search pattern, such as a spiral, or may be determined based on the classification result for previously collected opto-acoustic metrology data.

At block 914 of FIG. 9, the center of the bottom structure is found based on the determined location of the bottom structure. Data from the initial search performed in block 912 may be used to determine the center of the bottom structure, or additional opto-acoustic metrology data may be collected, e.g., in a pre-defined pattern to determine the center of the bottom structure. For example, with respect to bottom structure 1124, shown in FIG. 11, with knowledge of the location of the edge 1110 extending in the Y direction and an edge 1112 extending in the Y direction, and knowledge of the structural details of the bottom structure 1124, the center of the bottom structure 1124 may be calculated.

At block 916, the alignment of the target structures may be calculated using the optical image of the top structure, obtained, e.g., at block 910, and the center of the bottom structure, e.g., determined at block 912. In some implementations, the relative position of the top structure with respect to the bottom structure may be determined in the XY coordinate system. The alignment of the top and bottom structures may be calculated based on respective centers of the structures or based on distance between edges on the top structure with respect to edges on the bottom structure (which obviate the need for block 914), or in any other desired manner. The alignment of the top structure with respect to the bottom structure provides the measurement of overlay error between the layer that includes top structure and the layer that includes the bottom structure.

At block 918, the process may be repeated for additional targets on the sample, e.g., by repeating the process at block 908 for a different target on a current die or on a different die. If a new product is introduced, the process may repeat beginning at block 902.

Figure 12:
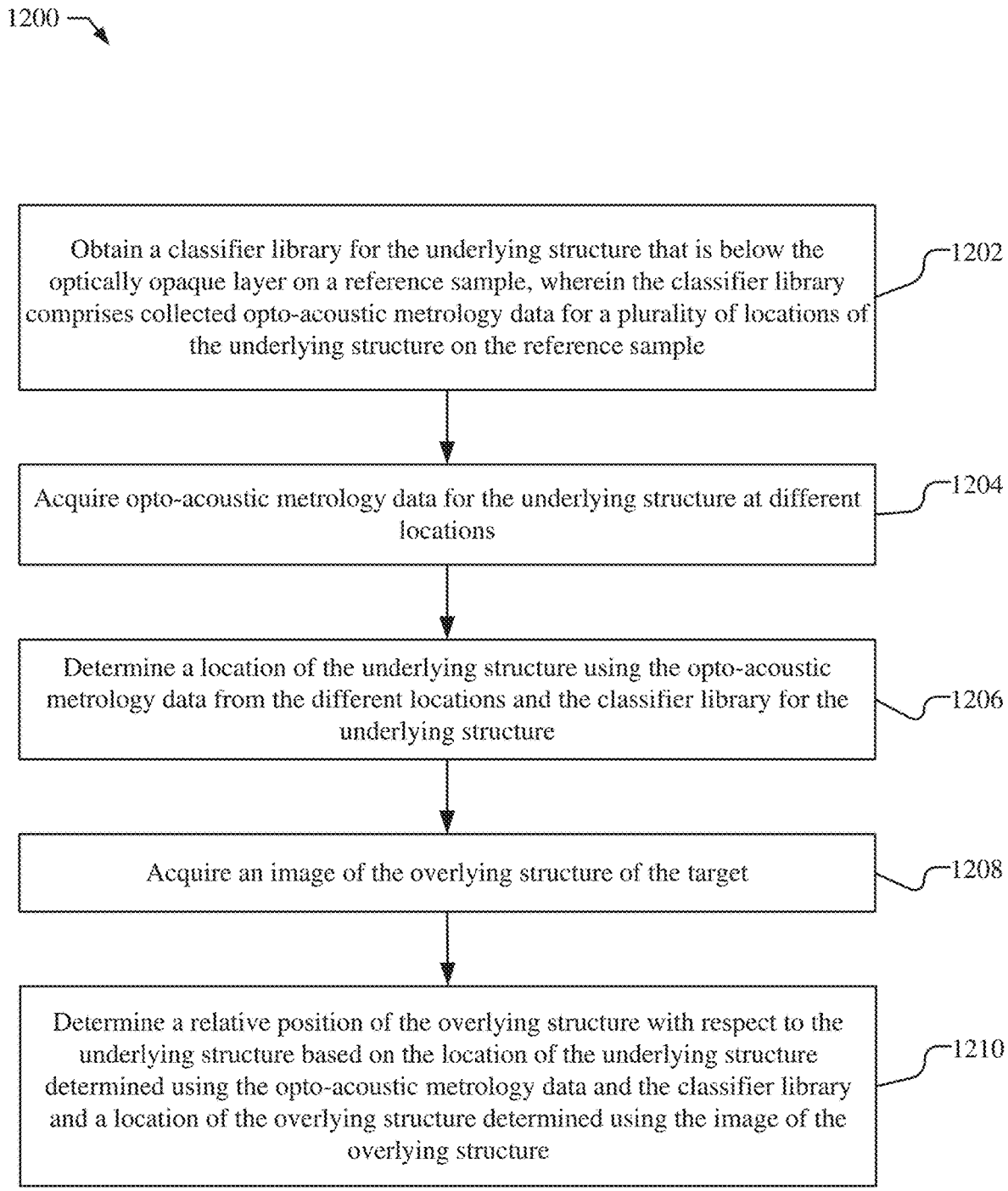
FIG. 12 is a flow chart illustrating a process of non-destructive opto-acoustic metrology of a target on a sample, the target comprising an overlying structure and an underlying structure, and an optically opaque layer is disposed between the overlying structure and an underlying structure.

FIG. 12 is a flow chart 1200 illustrating a process of non-destructive opto-acoustic metrology of a target on a sample, the target comprising an overlying structure and an underlying structure, and an optically opaque layer is disposed between the overlying structure and an underlying structure. The process, for example, may performed using opto-acoustic metrology device 200 shown in FIG. 2 or opto-acoustic metrology device 300 shown in FIG. 3.

As illustrated, at block 1202, the process includes obtaining a classifier library for the underlying structure that is below the optically opaque layer on a reference sample, wherein the classifier library comprises collected opto-acoustic metrology data for a plurality of locations of the underlying structure on the reference sample, e.g., as discussed in reference to blocks 904 and 906 of FIG. 9 and FIG. 10. The collected opto-acoustic metrology data for the plurality of locations of the underlying structure on the reference sample for the classifier library for example may include locations on the underlying structure and locations off the underlying structure. A means for obtaining a classifier library for the underlying structure that is below the optically opaque layer on a reference sample, wherein the classifier library comprises collected opto-acoustic metrology data for a plurality of locations of the underlying structure on the reference sample may include, e.g., the opto-acoustic metrology device 200 shown in FIG. 2 or opto-acoustic metrology device 300 shown in FIG. 3.

At block 1204, opto-acoustic metrology data for the underlying structure is acquired at different locations, e.g., as discussed in reference to blocks 912 and 914 of FIG. 9 and FIG. 11. A means for acquiring opto-acoustic metrology data for the underlying structure at different locations may include, e.g., the opto-acoustic metrology device 200 shown in FIG. 2 or opto-acoustic metrology device 300 shown in FIG. 3.

At block 1206, a location of the underlying structure is determined using the opto-acoustic metrology data from the different locations and the classifier library for the underlying structure, e.g., as discussed in reference to blocks 912 and 914 of FIG. 9 and FIG. 11. A means for determining a location of the underlying structure using the opto-acoustic metrology data from the different locations and the classifier library for the underlying structure may include, e.g., the opto-acoustic metrology device 200 shown in FIG. 2 or opto-acoustic metrology device 300, including the processor 330 shown in FIG. 3.

At block 1208, an image of the overlying structure of the target is acquired, e.g., as discussed in reference to blocks 910 of FIG. 9. A means for acquiring an image of the overlying structure of the target may include, e.g., the imaging device 240 shown in FIG. 2 or the imaging device 340 shown in FIG. 3.

At block 1206, a relative position of the overlying structure with respect to the underlying structure is determined based on the location of the underlying structure determined using the opto-acoustic metrology data and the classifier library and a location of the overlying structure determined using the image of the overlying structure, e.g., as discussed in reference to block 916 of FIG. 9. The determination of the relative position of the overlying structure with respect to the underlying structure may be an overlay determination, e.g., as discussed in reference to block 916 of FIG. 9. A means for determining a relative position of the overlying structure with respect to the underlying structure based on the location of the underlying structure determined using the opto-acoustic metrology data and the classifier library and a location of the overlying structure determined using the image of the overlying structure may include, e.g., the opto-acoustic metrology device 200 shown in FIG. 2 or opto-acoustic metrology device 300, including the processor 330 shown in FIG. 3.

In some implementations, acquiring the opto-acoustic metrology data for the underlying structure at the different locations and determining the location of the underlying structure using the opto-acoustic metrology data and the classifier library for the underlying structure may include iteratively acquiring opto-acoustic metrology data for the underlying structure at different locations and determining if the opto-acoustic metrology data for the underlying structure is from locations on the underlying structure or locations off the underlying structure based on the classifier library until the location of the target is determined, e.g., as discussed in reference to blocks 912 and 914 of FIG. 9 and FIG. 11. For example, iteratively acquiring opto-acoustic metrology data for the underlying structure at different locations may including scanning the sample in a pre-defined search pattern between acquisition of opto-acoustic metrology data at each location, e.g., as discussed in reference to blocks 912 and 914 of FIG. 9 and FIG. 11. In some implementations, the pre-defined search pattern is a spiral. A means for iteratively acquiring opto-acoustic metrology data for the underlying structure at different locations and determining if the opto-acoustic metrology data for the underlying structure is from locations on the underlying structure or locations off the underlying structure based on the classifier library until the location of the target is determined may include, e.g., the opto-acoustic metrology device 200 shown in FIG. 2 or opto-acoustic metrology device 300, including the processor 330 shown in FIG. 3.

In some implementations, acquiring opto-acoustic metrology data for the underlying structure at each of the different locations may include directing an excitation beam at a location on the sample at an estimated location of the underlying structure, wherein an acoustic wave in the sample is produced in response to the excitation beam, e.g., as discussed in reference to FIGS. 2 and 3. A probe beam may be directed at the location on the sample, e.g., as discussed in reference to FIGS. 2 and 3. The opto-acoustic metrology data, e.g., change in reflectivity, from interaction of the reflected acoustic wave and the probe beam may be detected, e.g., as discussed in reference to FIGS. 2 and 3.

A means for directing an excitation beam at a location on the sample at an estimated location of the underlying structure, wherein an acoustic wave in the sample is produced in response to the excitation beam may include, e.g., the pump laser 220 shown in FIG. 2, or the laser and components for the pump beam of the opto-acoustic metrology device 300 shown in FIG. 3. A means for directing a probe beam at the location on the sample may be, e.g., the probe laser 222 shown in FIG. 2, or the laser and components for the probe beam of the opto-acoustic metrology device 300 shown in FIG. 3. A means for detecting the opto-acoustic metrology data from interaction of the reflected acoustic wave and the probe beam may be, e.g., the sensor 228 shown in FIG. 2 or the detector D1 of the opto-acoustic metrology device 300 shown in FIG. 3.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:
1. A method of non-destructive opto-acoustic metrology of a target on a sample, the target comprising an overlying structure and an underlying structure, and an optically opaque layer is disposed between the overlying structure and the underlying structure, the method comprising:
- acquiring opto-acoustic metrology data for the underlying structure at different locations;
- determining a location of the underlying structure using the opto-acoustic metrology data from the different locations;
- acquiring an image of the overlying structure of the target; and
- determining a relative position of the overlying structure with respect to the underlying structure based on the location of the underlying structure determined using the opto-acoustic metrology data and a location of the overlying structure determined using the image of the overlying structure.

2. The method of claim 1, wherein the different locations at which the opto-acoustic metrology data for the underlying structure is acquired comprises locations on the underlying structure and locations off the underlying structure.

3. The method of claim 1, wherein acquiring the opto-acoustic metrology data for the underlying structure at the different locations and determining the location of the underlying structure using the opto-acoustic metrology data comprises:
- iteratively acquiring opto-acoustic metrology data for the underlying structure at different locations and determining if the opto-acoustic metrology data for the underlying structure is from locations on the underlying structure or locations off the underlying structure until the location of the target is determined.

4. The method of claim 3, wherein iteratively acquiring opto-acoustic metrology data for the underlying structure at different locations comprises scanning the sample in a pre-defined search pattern between acquisition of opto-acoustic metrology data at each location.

5. The method of claim 1, wherein acquiring opto-acoustic metrology data for the underlying structure at each of the different locations comprises:
- directing an excitation beam at a location on the sample at an estimated location of the underlying structure, wherein an acoustic wave in the sample is produced in response to the excitation beam;
- directing a probe beam at the location on the sample; and
- detecting the opto-acoustic metrology data from interaction of the acoustic wave and the probe beam.

6. The method of claim 1, wherein determining the relative position of the overlying structure with respect to the underlying structure comprises an overlay determination.

7. The method of claim 1, further comprising obtaining a localized mapping of the underlying structure, wherein the localized mapping comprises collected opto-acoustic metrology data for a plurality of locations of the underlying structure, wherein determining the location of the underlying structure uses the opto-acoustic metrology data from the different locations and the localized mapping of the underlying structure.

8. The method of claim 1, further comprising obtaining a classifier library for the underlying structure that is below the optically opaque layer on a reference sample, wherein the classifier library comprises collected opto-acoustic metrology data for a plurality of locations of the underlying structure on the reference sample, wherein determining the location of the underlying structure uses the opto-acoustic metrology data from the different locations and the classifier library for the underlying structure.

9. An apparatus for non-destructive acoustic metrology of a target on a sample, the target comprising an overlying structure and an underlying structure, and an optically opaque layer is disposed between the overlying structure and the underlying structure, comprising:
- an opto-acoustic metrology device configured to acquire opto-acoustic metrology data for the underlying structure at different locations;
- an imaging device configured to image the sample;
- a stage for holding the sample and configured to move the sample with respect to the opto-acoustic metrology device;
- at least one processor coupled to the opto-acoustic metrology device, the imaging device, and the stage, the at least one processor configured to:
  - acquire opto-acoustic metrology data from the opto-acoustic metrology device for the underlying structure at different locations;
  - determine a location of the underlying structure using the opto-acoustic metrology data from the different locations;
  - acquire an image of the overlying structure of the target from the imaging device; and
  - determine a relative position of the overlying structure with respect to the underlying structure based on the location of the underlying structure determined using the opto-acoustic metrology data and a location of the overlying structure determined using the image of the overlying structure.

10. The apparatus of claim 9, wherein the different locations at which the opto-acoustic metrology data for the underlying structure is acquired comprises locations on the underlying structure and locations off the underlying structure.

11. The apparatus of claim 9, wherein the at least one processor is configured to acquire the opto-acoustic metrology data for the underlying structure at the different locations and determine the location of the underlying structure using the opto-acoustic metrology data by being configured to:
- iteratively acquire opto-acoustic metrology data for the underlying structure at different locations and determine if the opto-acoustic metrology data for the underlying structure is from locations on the underlying structure or locations off the underlying structure until the location of the target is determined.

12. The apparatus of claim 11, wherein the at least one processor is configured to iteratively acquire opto-acoustic metrology data for the underlying structure at different locations by being configured to control the stage to scan the sample in a pre-defined search pattern between acquisition of opto-acoustic metrology data at each location by the opto-acoustic metrology device.

13. The apparatus of claim 11, wherein the at least one processor is further configured to obtain a localized mapping of the underlying structure, wherein the localized mapping comprises collected opto-acoustic metrology data for a plurality of locations of the underlying structure, wherein the at least one processor is configured to determine the location of the underlying structure uses the opto-acoustic metrology data from the different locations and the localized mapping of the underlying structure.

14. The apparatus of claim 11, wherein the at least one processor is further configured to obtain a classifier library for the underlying structure that is below the optically opaque layer on a reference sample, wherein the classifier library comprises collected opto-acoustic metrology data for a plurality of locations of the underlying structure on the reference sample, wherein the at least one processor is configured to determine the location of the underlying structure using the opto-acoustic metrology data from the different locations and the classifier library for the underlying structure.

15. The apparatus of claim 9, wherein the opto-acoustic metrology device comprises:
- an excitation beam source configured to generate and direct an excitation beam at a location on the sample at an estimated location of the underlying structure, wherein an acoustic wave in the sample is produced in response to the excitation beam;
- a probe beam source configured to generate and direct a probe beam at the location on the sample; and
- a sensor configured to detect the opto-acoustic metrology data from interaction of the acoustic wave and the probe beam.

16. The apparatus of claim 9, wherein the at least one processor is configured to determine the relative position of the overlying structure with respect to the underlying structure in an overlay determination.

17. An apparatus for non-destructive acoustic metrology of a target on a sample, the target comprising an overlying structure and an underlying structure, and an optically opaque layer is disposed between the overlying structure and the underlying structure, comprising:
- means for acquiring opto-acoustic metrology data for the underlying structure at different locations;
- means for determining a location of the underlying structure using the opto-acoustic metrology data from the different locations;
- means for acquiring an image of the overlying structure of the target; and
- means for determining a relative position of the overlying structure with respect to the underlying structure based on the location of the underlying structure determined using the opto-acoustic metrology data and a location of the overlying structure determined using the image of the overlying structure.

18. The apparatus of claim 17, wherein the different locations at which the opto-acoustic metrology data for the underlying structure is acquired comprises locations on the underlying structure and locations off the underlying structure.

19. The apparatus of claim 17, wherein the means for acquiring the opto-acoustic metrology data for the underlying structure at the different locations and means for determining the location of the underlying structure using the opto-acoustic metrology data comprises:
- means for iteratively acquiring opto-acoustic metrology data for the underlying structure at different locations and means for determining if the opto-acoustic metrology data for the underlying structure is from locations on the underlying structure or locations off the underlying structure until the location of the target is determined.

20. The apparatus of claim 19, wherein the means for iteratively acquiring opto-acoustic metrology data for the underlying structure at different locations comprises means for scanning the sample in a pre-defined search pattern between acquisition of opto-acoustic metrology data at each location.

21. The apparatus of claim 17, wherein the means for determining the relative position of the overlying structure with respect to the underlying structure comprises an overlay determination.

22. The apparatus of claim 17, further comprising means for obtaining a localized mapping of the underlying structure, wherein the localized mapping comprises collected opto-acoustic metrology data for a plurality of locations of the underlying structure, wherein the means for determining the location of the underlying structure uses the opto-acoustic metrology data from the different locations and the localized mapping of the underlying structure.

23. The apparatus of claim 17, further comprising means for obtaining a classifier library for the underlying structure that is below the optically opaque layer on a reference sample, wherein the classifier library comprises collected opto-acoustic metrology data for a plurality of locations of the underlying structure on the reference sample, wherein the means for determining the location of the underlying structure uses the opto-acoustic metrology data from the different locations and the classifier library for the underlying structure.

* * * * *